(12) United States Patent
Lin et al.

(10) Patent No.: US 9,397,660 B2
(45) Date of Patent: Jul. 19, 2016

(54) TOUCH PANEL

(71) Applicant: WINTEK CORPORATION, Taichung (TW)

(72) Inventors: Tzu-Ling Lin, New Taipei (TW); Kuo-Hsing Chen, New Taipei (TW); Chen-Hao Su, Taichung (TW); Yu-Ting Chen, Taoyuan County (TW); Kuo-Chang Su, Taichung (TW); Chin-Chang Liu, Taichung (TW)

(73) Assignee: WINTEK CORPORATION, Taichung (TW)

( * ) Notice: Subject to any disclaimer, the term of this patent is extended or adjusted under 35 U.S.C. 154(b) by 159 days.

(21) Appl. No.: 14/285,638

(22) Filed: May 23, 2014

(65) Prior Publication Data

US 2014/0346028 A1     Nov. 27, 2014

(30) Foreign Application Priority Data

May 24, 2013  (TW) .............................. 102118466 A (51) Int. Cl.
*H03K 17/975* (2006.01)
*H03K 3/017* (2006.01)
*H03K 17/96* (2006.01)

(52) U.S. Cl.
CPC .... *H03K 17/9622* (2013.01); *H03K 2017/9602* (2013.01); *H03K 2017/9613* (2013.01); *H03K 2217/960755* (2013.01)

(58) Field of Classification Search
CPC .............. H03K 17/9622; H03K 2217/960755; H03K 2017/9613; H03K 2017/9602
See application file for complete search history.

(56) References Cited

U.S. PATENT DOCUMENTS

2007/0222766 A1*  9/2007  Bolender ................ G06F 3/044
                                                             345/173

\* cited by examiner

*Primary Examiner* — Charles Hicks
(74) *Attorney, Agent, or Firm* — Ming Chow; Sinorica, LLC (57) ABSTRACT

A touch panel including a substrate, first electrodes, second electrodes, first wires, second wires and a means for shortening a gap between the second electrodes in a third direction is provided. The first electrodes are arranged sequentially in a first direction. Each first electrode has openings arranged in a second direction intersecting the first direction. The second electrodes are located in the openings. Each first electrode and the second electrodes surrounded by the first electrode constitute a sensing unit. The first wires and the second wires connect the first electrodes and the second electrodes to a driving circuit. The means for shortening the gap between the second electrodes in the third direction renders a ratio of the gap between the second electrodes in the third direction to that in the second direction to be smaller than 1:3.4, where the third direction intersects either the first direction or the second direction.

15 Claims, 10 Drawing Sheets

TOUCH PANEL

CROSS-REFERENCE TO RELATED APPLICATION

This application claims the priority benefit of Taiwan application serial no. 102118466, filed on May 24, 2013. The entirety of the above-mentioned patent application is hereby incorporated by reference herein and made a part of this specification.

BACKGROUND

1. Technical Field

The invention relates to a touch panel. Particularly, the invention relates to a touch panel with non-intersected sensing electrodes.

2. Related Art

A capacitive touch panel detects a touch position of a finger or a conductive object though a capacitance variation generated when a user touches the capacitive touch panel by using the finger or the conductive object. The capacitive touch panel generally has double conductive layers electrically isolated to each other. In case that the user does not touch the touch panel, the double conductive layers have an initial capacitance value there between. When the user touches the touch panel, the capacitance value between the double conductive layers is changed. Now, the position touched by the user can be determined by detecting a position where the capacitance value is changed.

As development of the touch panel ane the user's demand of lightness, slimness, shortness and smallness on information products, a thickness of the touch panel is required to be further decreased, so that a single layer touch panel is developed. Since the single layer touch panel has a single layer substrate and a single conductive layer, the thickness of the touch panel is greatly decreased. However, by using the single conductive layer to fabricate sensing electrodes and transmission wires, a configuration position of the transmission wires cannot not be configured with the sensing electrodes, which increases a size of an invalid sensing area. Therefore, sensing linearity of the single layer touch panel is still required to be ameliorated.

SUMMARY

The invention is directed to a touch panel, which has ideal sensing linearity.

The invention provides a touch panel including a substrate, a plurality of first electrodes, a plurality of second electrodes, a plurality of first wires, a plurality of second wires and a means for shortening a gap between the second electrodes in a third direction. The first electrodes are disposed on the substrate and are arranged sequentially in a first direction. Each of the first electrodes has a plurality of openings arranged in a second direction, where the first direction and the second direction are intersected. The second electrodes are disposed on the substrate and are respectively located in the openings. Each of the first electrodes surrounds the second electrodes arranged along the second direction in a same column in the second electrodes to constitute a sensing unit, and the sensing units are sequentially arranged along the first direction. The first wires connect the first electrodes to a driving circuit. The second wires connect the second electrodes to the driving circuit. The means for shortening the gap between the second electrodes in the third direction renders a ratio of the gap between the second electrodes in the third direction and a gap between the second electrodes in the second direction to be smaller than 1:3.4, in which the third direction is intersected to both of the first direction and the second direction.

In an embodiment of the invention, each of the second electrodes has a central pattern. A minimum gap between the central patterns of two of the second electrodes in the third direction is d1. Now, the means for shortening the gap between the second electrodes in the third direction includes configuring a protrusion pattern for connecting the central pattern to constitute each of the second electrodes, where the protrusion pattern protrudes out from the central pattern towards the third direction, such that the minimum gap between the two second electrodes in the third direction is smaller than d1.

In an embodiment of the invention, each of the second wires has a first terminal and a second terminal, the first terminal is connected to the corresponding one of the second electrodes, and the second terminal of the second wire points to a first side of the substrate along the second direction. For example, a second wire connected to a $(2j-1)^{th}$ second electrode in a $(2i-1)^{th}$ sensing unit is located between the $(2i-1)^{th}$ sensing unit and a subsequent sensing unit, a second wire connected to a $2j^{th}$ second electrode in the $(2i-1)^{th}$ sensing unit is located between the $(2i-1)^{th}$ sensing unit and a previous sensing unit, a second wire connected to a $(2j-1)^{th}$ second electrode in a $2i^{th}$ sensing unit is located between the $2i^{th}$ sensing unit and a previous sensing unit, and a second wire connected to a $2j^{th}$ second electrode in the $2i^{th}$ sensing unit is located between the 2ith sensing unit and the subsequent sensing unit, where i and j are respectively positive integers, and the means of shortening the gap between the second electrodes in the third direction includes connecting a second wire connected to a 1st second electrode in the $(2i-1)^{th}$ sensing unit with a second wire connected to a 1st second electrode in the $2i^{th}$ sensing unit and connecting a second wire connected to a $2^{nd}$ second electrode in the $(2i+1)^{th}$ sensing unit with a second wire connected to a $2^{nd}$ second electrode in the $2i^{th}$ sensing unit. Moreover, a second side of the substrate is opposite to the first side, and the means of shortening the gap between the second electrodes in the third direction includes gradually decreasing widths of the second electrodes of at least a part of the sensing units from the second side towards the first side.

In an embodiment of the invention, each of the second wires has a first terminal and a second terminal, and the first terminal is connected to the corresponding one of the second electrodes. Moreover, the means of shortening the gap between the second electrodes in the third direction includes that the second wires connected to a $(2i-1)^{th}$ sensing unit and the second wires connected to a $2i^{th}$ sensing unit are located between the $(2i-1)^{th}$ sensing unit and the $2i^{th}$ sensing unit, where i is a positive integer. Meanwhile, the second wire is not disposed between the $(2i+1)^{th}$ sensing unit and the $2i^{th}$ sensing unit. Moreover, the second terminal of the second wire connected to the $(2i-1)^{th}$ sensing unit points to a first side of the substrate along the second direction, the second terminal of the second wire connected to the $2i^{th}$ sensing unit points to a second side of the substrate along the second direction, where the first side is opposite to the second side. In this way, the means of shortening the gap between the second electrodes in the third direction further includes connecting a second wire connected to a second electrode closest to the second side in the (2i-1)th sensing unit with a second wire connected to a second electrode closest to the first side in the 2ith sensing unit.

In an embodiment of the invention, the means of shortening the gap between the second electrodes in the third direction includes that the second electrodes of the $(2i-1)^{th}$ sensing unit correspond to a position of the gaps between the second electrodes of the 2ith sensing unit such that a direction of connection lines of the second electrodes of the $(2i-1)^{th}$ sensing unit and the second electrodes of the $2i^{th}$ sensing unit is intersected to the first direction.

In an embodiment of the invention, each of the second electrodes has a comb-shape contour.

According to the above descriptions, in the touch panel of the invention, by shortening the gap between the second electrodes in the third direction, the sensing linearity of the touch panel is ameliorated.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
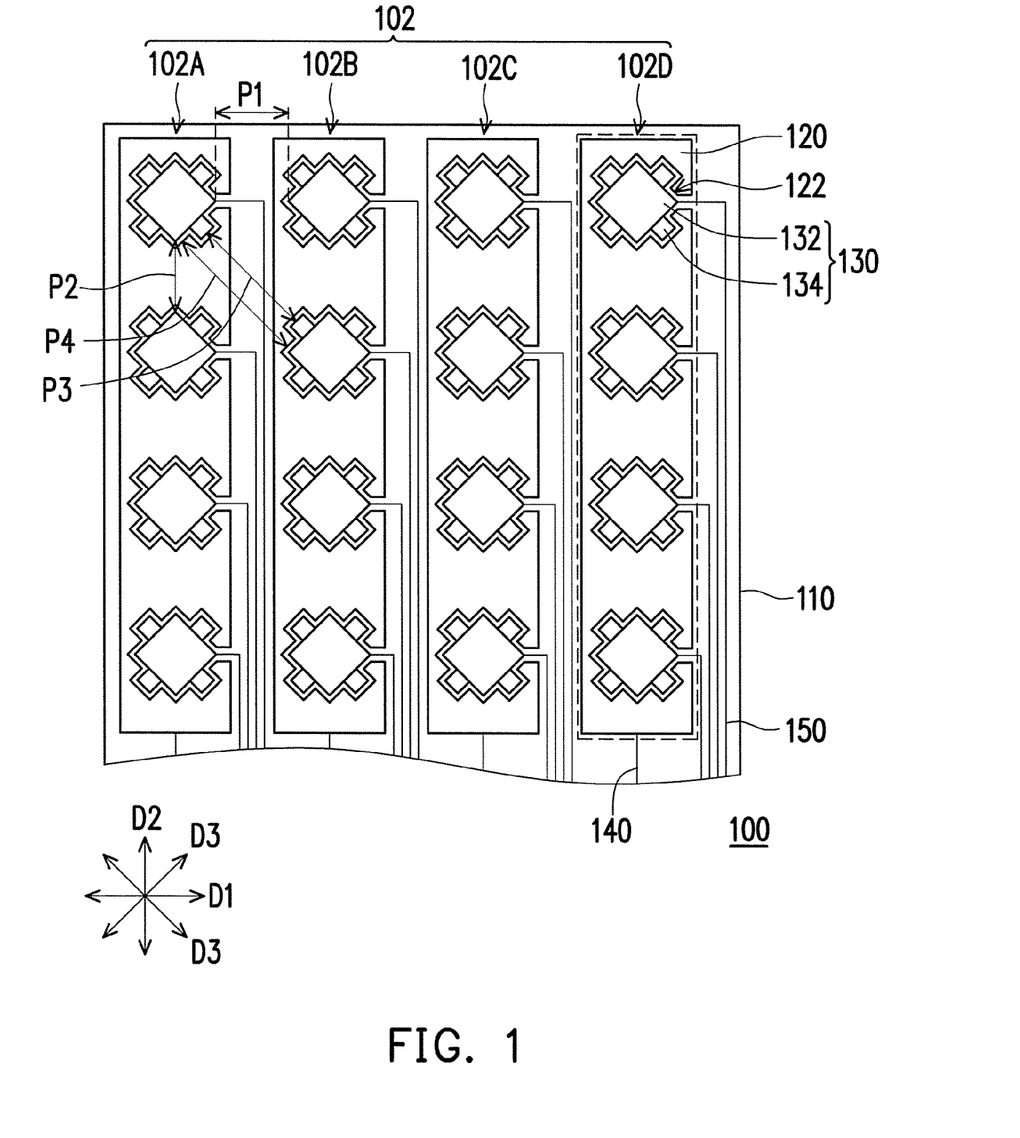
FIG. 1 is a top view of a touch panel according to a first embodiment of the invention.

FIG. 1 is a top view of a touch panel according to a first embodiment of the invention. Referring to FIG. 1, the touch panel 100 includes a substrate 110, a plurality of first electrodes 120, a plurality of second electrodes 130, a plurality of first wires 140 and a plurality of second wires 150. The first electrodes 120, the second electrodes 130, the first wires 140 and the second wires 150 are all disposed on the substrate 110. Moreover, the first electrodes 120, the second electrodes 130, the first wires 140 and the second wires 150 are not intersected, and can be fabricated by a same conductive layer. However, in other embodiments, the first electrodes 120 and the second electrodes 130 can be fabricated by a first conductive material, and the first wires 140 and the second wires 150 can be fabricated by a second conductive material, where the first conductive material and the second conductive material can be the same or different, and can be a metal, a metal stacked layer, a metal oxide, an organic conductive material or a combination thereof.

In detail, the first electrodes 120 are sequentially arranged along a first direction D1, and each of the first electrodes 120 has a bar-shape contour and extends along a second direction D2, where the first direction D1 is intersected to the second direction D2. Moreover, each of the electrodes 120 has a plurality of openings 122 arranged in the second direction D2. In the present embodiment, each of the openings 122 is an opened opening without separating the first electrode 120 such that each of the first electrodes 120 is composed of a continuous pattern.

The second electrodes 130 are respectively located in the corresponding openings 122, and each of the second electrodes 130 is located in a corresponding one of the openings 122. In this way, each of the first electrodes 120 surrounds a plurality of the second electrodes 130 arranged along the second direction D2 in a same column to constitute a sensing unit 102. The sensing units 102 composed of the first electrode 120 and the second electrodes 130 are sequentially arranged along the first direction D1. In the present embodiment, a situation that four sensing units 102 are disposed on the touch panel 100 and each of the first electrodes 120 surrounds four of the second electrodes 130 is only taken as an example, and is not used to limit the scope of the invention. In other embodiments, the number of the sensing units 102 and the number of the second electrodes 130 surrounded by each of the first electrodes 120 can be determined according to a size and a resolution requirement of the touch panel 100.

The sensing units 102 can be sequentially defined as a first sensing unit 102A, a second sensing unit 102B, a third sensing unit 102C and a fourth sensing unit 102D. When the touch sensing of the touch panel 100 is performed, the first sensing unit 102A, the second sensing unit 102B, the third sensing unit 102C and the fourth sensing unit 102D are enabled sequentially. In detail, when the first electrode 120 of the first sensing unit 102A receives a driving signal, the second electrodes 130 of the first sensing unit 102A execute a sensing function to determine whether the touch operation is occurred in the first sensing unit 102A. Similarly, the second sensing unit 102B, the third sensing unit 102C and the fourth sensing unit 102D also execute the aforementioned operation to perform the touch sensing function. However, the first electrodes 120 can receive the driving signal in different timings.

In the present embodiment, the second electrodes 130 are arranged along the first direction D1 and the second direction D2 to form an array, so that in a third direction D3 that is neither parallel to the first direction D1 nor parallel to the second direction D2, a gap P3 between the adjacent second electrodes 130 is greater than a gap P1 between the adjacent second electrodes 130 in the first direction D1 and a gap P2 between the adjacent electrodes 130 in the second direction D2. The third direction D3 is intersected to both of the first direction D1 and the second direction D2. The second electrodes 130 are electrodes used for providing a sensing function. The greater the gap between the adjacent second electrodes 130 is, the more discontinuous the sensed signal is, which leads to a problem of poor sensing linearity. Therefore, the design of the touch panel 100 further includes a means for shortening the gap P3 between the second electrodes 130 in the third direction D3, such that a ratio of the gap P3 between the second electrodes 130 in the third direction D3 and the gap P2 between the second electrodes 130 in the second direction is about or lower than 1:3.4. In this way, the touch panel 100 may have an ideal sensing linearity. In addition, the gap P2 and the gap P3 in the drawings of the invention are not sketched for the real distance, but for illustration only. Accordingly, the ratio between the gap P3 and the gap P2 should be refer to the description and the claim thereof.

In detail, the means for shortening the gap P3 between the second electrodes 130 in the third direction D3 includes a pattern design of the second electrodes 130. Here, each of the second electrodes 130 has a central pattern 132, and a minimum gap P4 between two adjacent central patterns 132 of the second electrodes 130 in the third direction D3 is d1. Now, the means for shortening the gap P3 between the second electrodes 130 in the third direction D3 includes configuring a protrusion pattern 134 from the central pattern 132 towards the third direction D3 to constitute each of the second electrodes 130, such that the gap P3 between the two second electrodes 130 in the third direction D3 can be smaller than d1. In the present embodiment, the central pattern 132 is approximately a diamond pattern, though the invention is not limited thereto.

Figure 2:
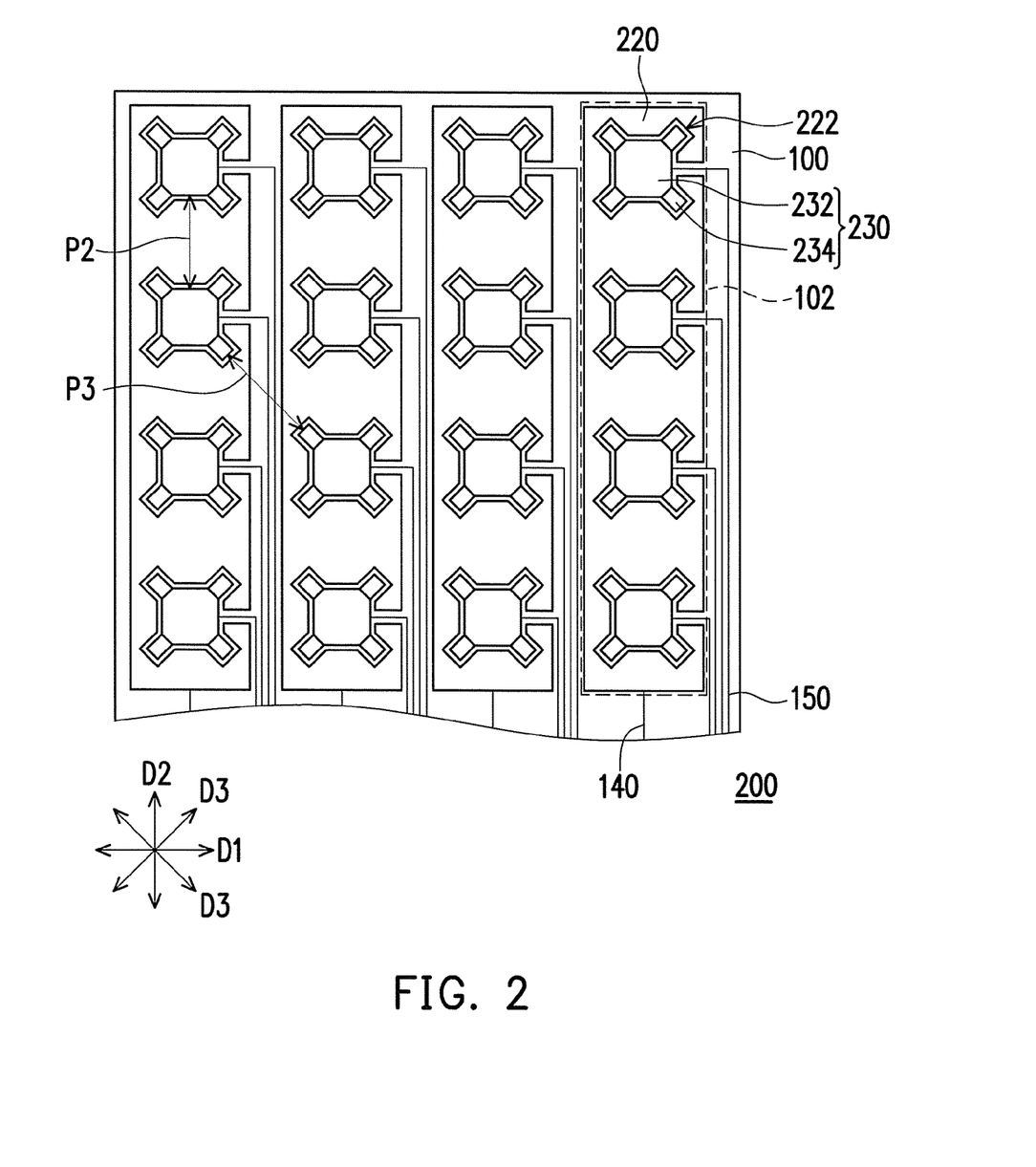
FIG. 2 is a top view of a touch panel according to a second embodiment of the invention.

FIG. 2 is a top view of a touch panel according to a second embodiment of the invention. Referring to FIG. 2, the touch panel 200 is similar to the touch panel of the first embodiment, and a difference there between is that central patterns 232 thereof are rectangles. A protrusion pattern 234 protrudes out from the central pattern 232 towards the third direction D3, so as to shorten the gap P3 between second electrodes 230 in the third direction D3 to increase sensing linearity of the touch panel 200, and maintain a strength of the sensing signal obtained when the touch operation is performed along any path to be above 29%. It should be noticed that in the touch panel 200, the means for shortening the gap P3 between the second electrodes 230 in the third direction D3 renders a ratio of the gap P3 between the second electrodes 230 in the third direction D3 and the gap P2 between the second electrodes 230 in the second direction D2 to be complied with 1:3.4.

Figure 3:
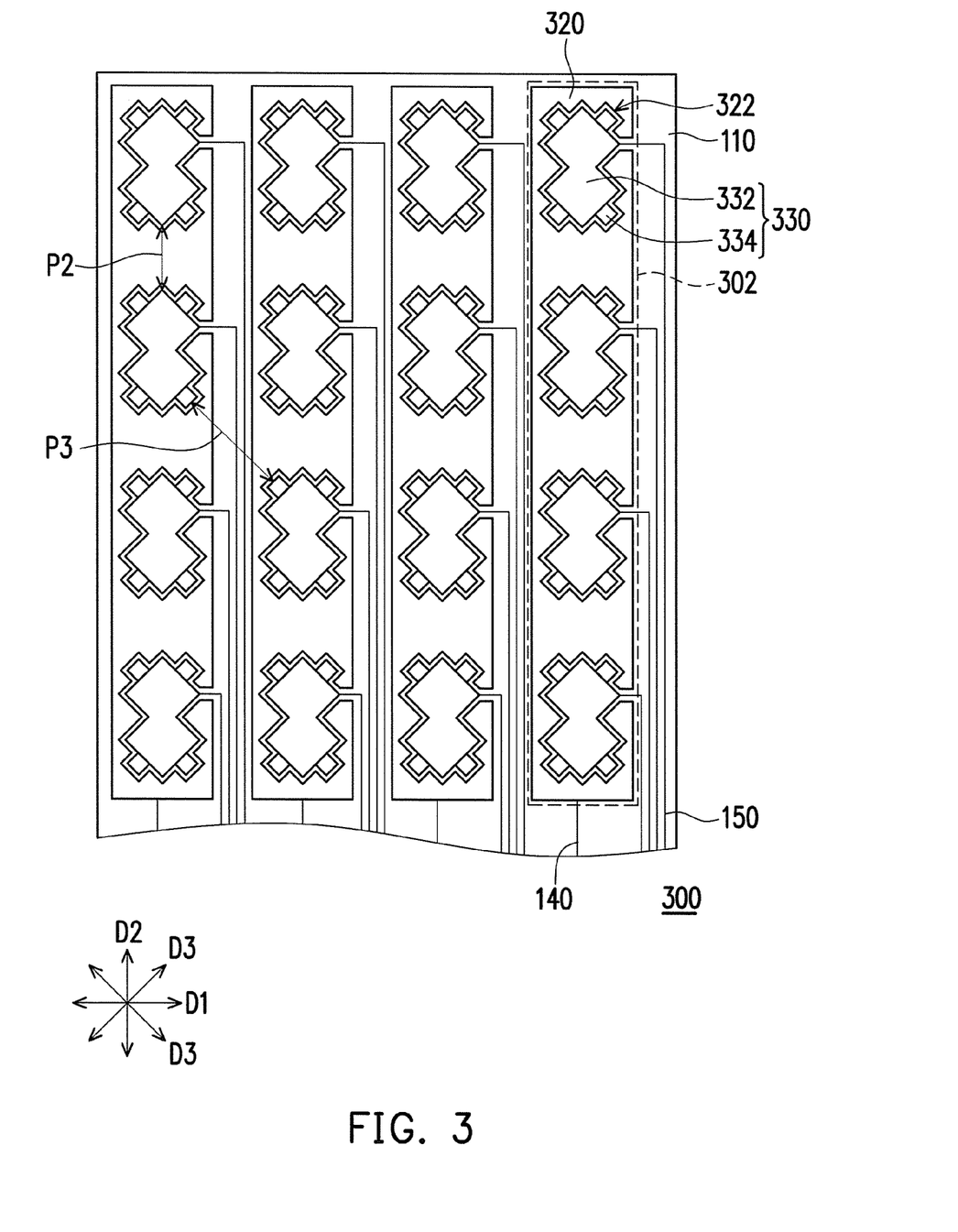
FIG. 3 is a top view of a touch panel according to a third embodiment of the invention.

FIG. 3 is a top view of a touch panel according to a third embodiment of the invention. Referring to FIG. 3, the touch panel 300 is similar to the touch panel 100 of the first embodiment, and a difference there between is that a central pattern 332 is a double diamond, which has more fringe capacitance sensing amount compared to the patterns of FIG. 1 and FIG. 2, so that an obtained capacitance variation amount is increased, and the signal is accordingly strengthened. A protrusion pattern 334 protrudes out from the central pattern 332 towards the third direction D3, so as to shorten the gap P3 between the second electrodes 330 in the third direction D3 to enhance the sensing linearity of the touch panel 300. It should be noticed that in the touch panel 300, the means for shortening the gap P3 between the second electrodes 330 in the third direction D3 renders a ratio of the gap P3 between the second electrodes 330 in the third direction D3 and the gap P2 between the second electrodes 330 in the second direction D2 to be complied with 1:3.4. In the aforementioned embodiments, although the ratio of the gap P3 to the gap P2 complied with 1:3.4 is taken as an example for descriptions, the ratios of the gap P3 to the gap P2 smaller than 1:3.4 can all maintain a strength of the sensing signal obtained when the touch operation is performed along any path to be above 29%, so that the ratios of the gap P3 to the gap P2 smaller than 1:3.4 are all within the scope of the invention.

Figure 4:
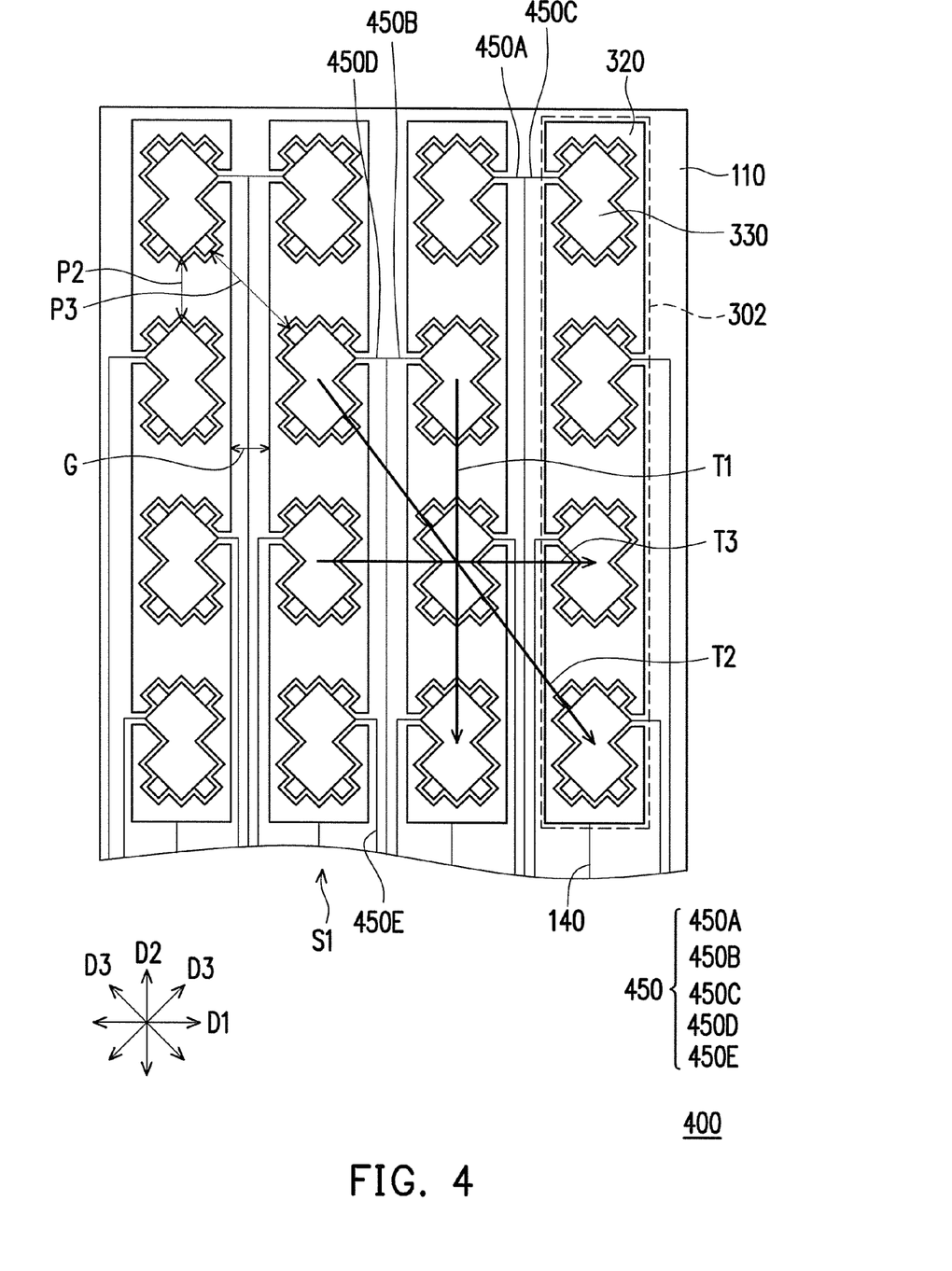
FIG. 4 is a top view of a touch panel according to a fourth embodiment of the invention.

FIG. 4 is a top view of a touch panel according to a fourth embodiment of the invention. Referring to FIG. 4, the touch panel 400 is similar to the touch panel 300 of the third embodiment, and includes the substrate 110, a plurality of first electrodes 320, a plurality of second electrodes 330, a plurality of the first wires 140 and a plurality of second wires 450, where the first electrodes 320 and the second electrodes 330 constitute a plurality of sensing units 302. A pattern design of the first electrodes 320 and the second electrodes 330 may refer to related descriptions of the third embodiment and is not repeated. Moreover, the first wires 140 are configured to respectively connect the first electrodes 320 to a driving circuit, and the second wires 450 are configured to respectively connect the second electrodes 330 to the driving circuit.

In the present embodiment, each of the second wires 450 has a first terminal and a second terminal, the first terminal is connected to the corresponding one of the second electrodes 330, and the second terminal points to a first side S1 of the substrate 110 along the second direction D2. In detail, a second wire 450A connected to a $(2j-1)^{th}$ second electrode 330 in a $(2i-1)^{th}$ sensing unit 302 is located between the $(2i-1)^{th}$ sensing unit 302 and a subsequent sensing unit 302; a second wire 450B connected to a $2j^{th}$ second electrode 330 in the $(2i-1)^{th}$ sensing unit 302 is located between the $(2i-1)^{th}$ sensing unit 302 and a previous sensing unit 302. Moreover, a second wire 450c connected to a $(2j-1)^{th}$ second electrode 330 in a $2i^{th}$ sensing unit 302 is located between the $2i^{th}$ sensing unit 302 and the previous sensing unit 302, and a second wire 450D connected to a $2j^{th}$ second electrode 330 in the $2i^{th}$ sensing unit 302 is located between the $2i^{th}$ sensing unit 302 and the subsequent sensing unit 302, where i and j are respectively positive integers.

In the present embodiment, the means of shortening the gap P3 between the second electrodes 330 in the third direction D3 adopted by the touch panel 400 is, for example, to shorten a gap G between two sensing units 302. In detail, the second wire 450A connected to the $1^{st}$ second electrode 330 in the $(2i-1)^{th}$ sensing unit 302 is connected with a second wire 450C connected to the $1^{st}$ second electrode 330 in the $2i^{th}$ sensing unit 302, and the second wire 450B connected to a $2^{nd}$ second electrode 330 in the $(2i+1)^{th}$ sensing unit 302 is connected with the second wire 450D connected to a $2^{nd}$ second electrode 330 in the $2i^{th}$ sensing unit 302. Meanwhile, the other second wires 450 can be regarded as the second wire 450E, and the second wires 450E are independent to each other and are not connected to the other wires. In this way, the second wire 450A and the second wire 450C can be connected to a driving chip through a same conductive path, and the second wire 450B and the second wire 450D can also be connected to the driving chip through a same conductive path, so as to reduce the gap G to shorten the gap P3 between the second electrodes 330 along the third direction D3. It should be noticed that the conductive path of the second wires 450 of the present embodiment can be applied to any one of the touch panels 100-200 to further enhance the sensing linearity of the touch panels 100-200.

Figure 5A:
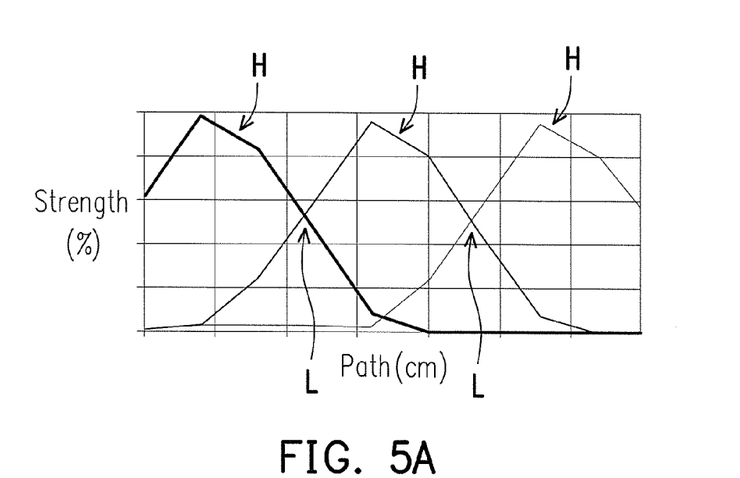
FIG. 5A to FIG. 5C respectively illustrate sensing signals obtained when touch operations are performed on the touch panel 400 of the fourth embodiment along three paths T1, T2 and T3 in a simulation test.
Figure 5B:
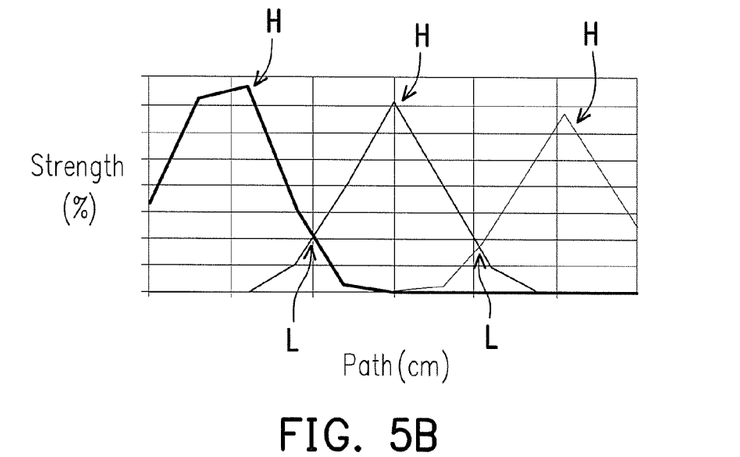
Figure 5C:
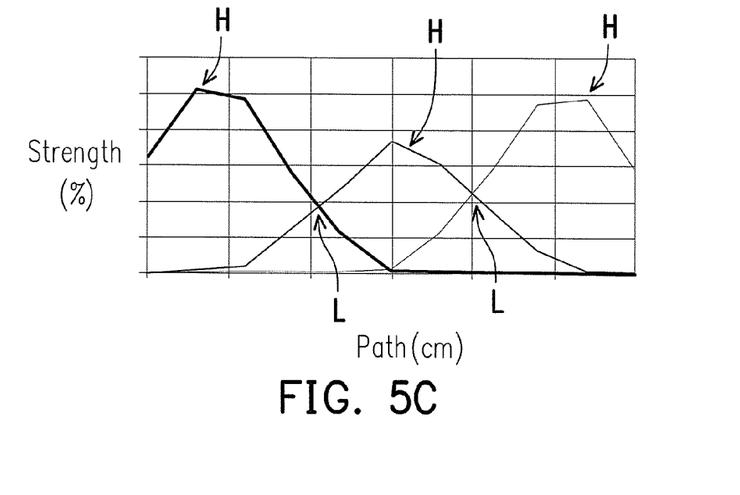

FIG. 5A to FIG. 5C respectively illustrate sensing signals obtained when touch operations are performed on the touch panel 400 of the fourth embodiment along three traces T1, T2 and T3 in a simulation test. According to FIG. 5A to FIG. 5C, when a touch point is just located on the corresponding second electrode 330, the sensing signal is stronger, as that shown by a point H, and when the touch point is located between two second electrodes 330, the sensing signal sensed by the two electrodes 330 adjacent to the touch point is weaker, as that shown by a point L. Moreover, when the touch operation is performed along the trace T1, a strength of the sensing signal at the point L is higher than a strength of the sensing signal at the point L obtained when the touch operation is performed along the trace T2 or T3. Namely, when the touch operation is performed along the trace T1, continuity of the sensing signal is superior to that of the sensing signal obtained when the touch operation is performed along the trace T2 or T3, which is because that the gap P2 is smaller than the gap P3. However, according to the design of the present embodiment, the gap P3 is shortened, so that the strength of the sensing signal obtained when the touch operation is performed along the trace P3 is at least maintained to be beyond 29%. In this way, the sensing signals obtained when the touch operations are performed along the three traces T1, T2 and T3 on the touch panel 400 can be recognized, so as to achieve ideal sensing linearity.

Figure 6:
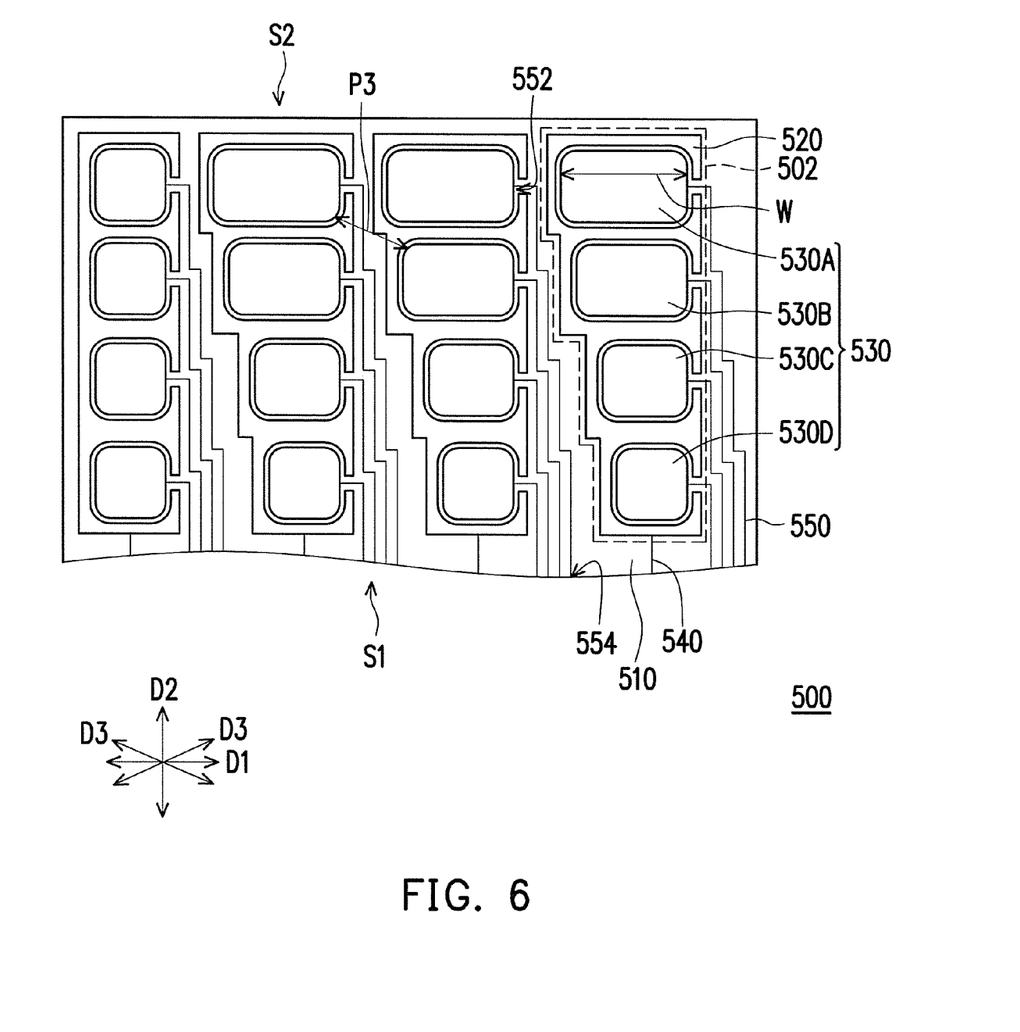
FIG. 6 is a top view of a touch panel according to a fifth embodiment of the invention.

FIG. 6 is a top view of a touch panel according to a fifth embodiment of the invention. Referring to FIG. 6, the touch panel 500 includes a substrate 510, a plurality of first electrodes 520, a plurality of second electrodes 530, a plurality of first wires 540 and a plurality of second wires 550. The first electrodes 520, the second electrodes 530, the first wires 540 and the second wires 550 are all disposed on the substrate 510. In the present embodiment, each of the first electrodes 520 surrounds a plurality of the second electrodes 530 to constitute a sensing unit 502. The first wires 540 are used to connect the first electrodes 520 to a driving circuit, and the second wires 550 are used to connect the second electrodes 530 to the driving circuit.

In the present embodiment, each of the second wires 550 has a first terminal 552 and a second terminal 554, where the first terminal can be defined as a terminal connected to a corresponding one of the second electrodes 530, and the second terminal 554 of each of the second wires 550 points towards a first side S1 of the substrate 510 along the second direction D2. Moreover, a second side S2 of the substrate 510 is opposite to the first side S1. In order to enhance the sensing linearity of the touch panel 500, the means for shortening the gap P3 between the second electrodes 530 in the third direction D3 adopted by the touch panel 500 is, for example, to enlarge a width W of the second electrode 530 without modifying a line width of the second wires 550.

In detail, the second electrodes 530 in the same sensing unit 502 are sequentially defined as a second electrode 530A, a second electrode 530B, a second electrode 530C and a second electrode 530D from the second side S2 to the first side S1, where only one second wire 550 is configured between two adjacent second electrodes 530A, and four second wires 550 are configured between two adjacent second electrodes 530D. Therefore, in the present embodiment, the widths W of the second electrodes 530 of at least a part of the sensing units 502 are gradually decreased from the second side S2 towards the first side S1 to reduce the gap P3 of the second electrode 530A, the second electrode 530B and the second electrode 530C along the third direction D3, which avails enhancing the sensing linearity of the touch panel 500.

Figure 7:
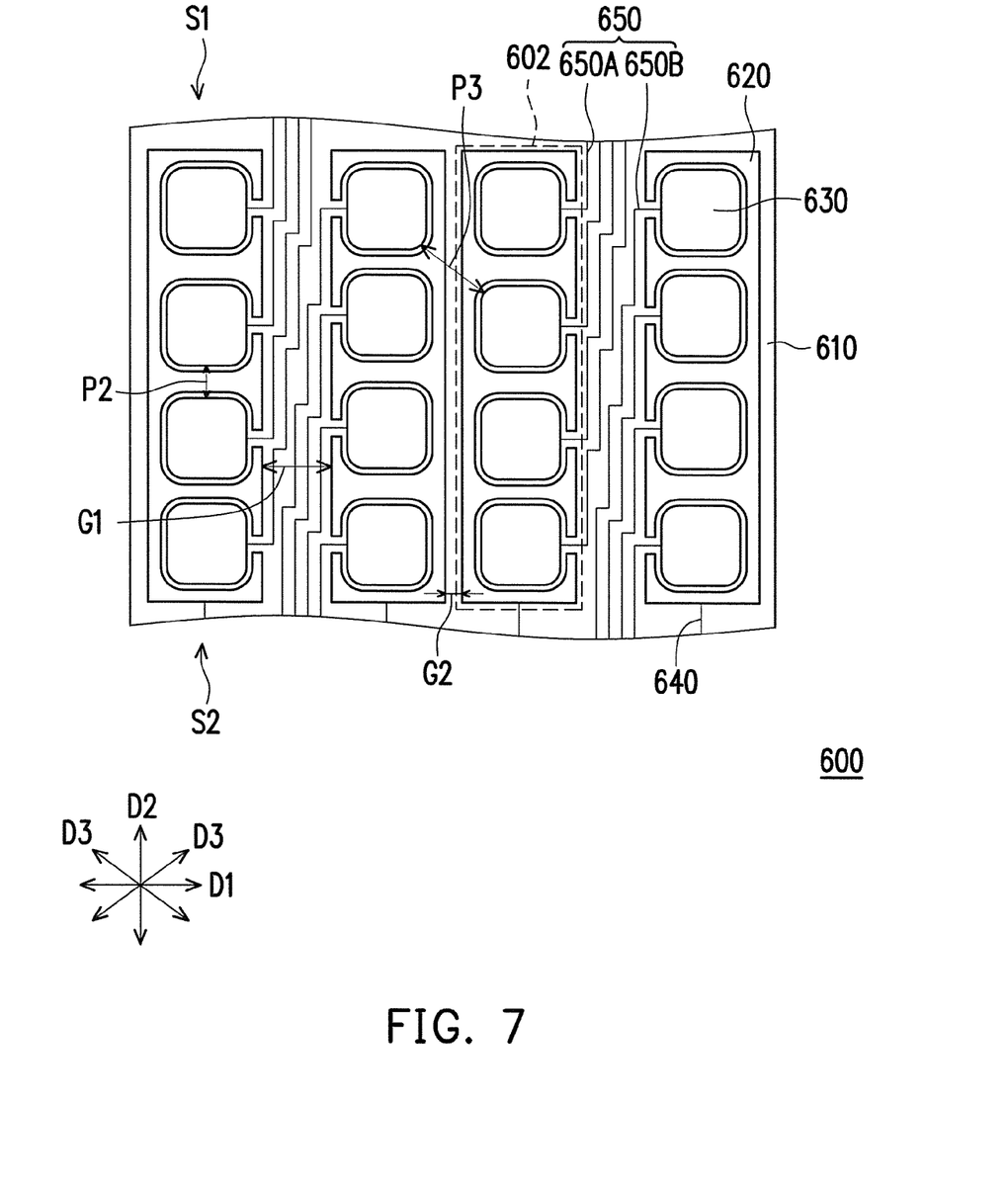
FIG. 7 is a top view of a touch panel according to a sixth embodiment of the invention.

FIG. 7 is a top view of a touch panel according to a sixth embodiment of the invention. Referring to FIG. 7, the touch panel 600 includes a substrate 610, a plurality of first electrodes 620, a plurality of second electrodes 630, a plurality of first wires 640 and a plurality of second wires 650. The first electrodes 620, the second electrodes 630, the first wires 640 and the second wires 650 are all disposed on the substrate 610. In the present embodiment, each of the first electrodes 620 surrounds a plurality of the second electrodes 630 to constitute a sensing unit 602. The first wires 640 are used to connect the first electrodes 620 to a driving circuit, and the second wires 650 are used to connect the second electrodes 630 to the driving circuit.

In the present embodiment, each of the second wires 650 has a first terminal and a second terminal, where the first terminal is connected to a corresponding one of the second electrodes 630. Moreover, the second wires 650 can be divided into second wires 650A and second wires 650B according to extending directions of the second terminals thereof. The second terminal of the second wire 650A connected to the $(2i-1)^{th}$ sensing unit 602 points to a first side S1 of the substrate 610 along the second direction D2, and the second terminal of the second wire 650B connected to the $2i^{th}$ sensing unit 602 points to a second side S2 of the substrate 601 along the second direction D2, where the first side S1 is opposite to the second side S2. Now, the second wire 650A connected to the $(2i-1)^{th}$ sensing unit 602 and the second wire 650B connected to the $2i^{th}$ sensing unit 602 are located between the $(2i-1)^{th}$ sensing unit 602 and the $2i^{th}$ sensing unit 602, where i is a positive integer. Therefore, the second wire 650 is not configured between the $(2i+1)^{th}$ sensing unit 602 and the $2i^{th}$ sensing unit 602, which avails shortening the gap P3 between the second electrodes 630 along the third direction D3.

In the present embodiment, a plurality of second wires 650A and 650B are configured between the $(2i-1)^{th}$ sensing unit 602 and the $2i^{th}$ sensing unit 602, though the second wires 650A and the second wires 650B extend towards different sides. Therefore, a gap G1 between the $(2i-1)^{th}$ sensing unit 602 and the $2i^{th}$ sensing unit 602 is not excessively increased. Moreover, none of the wires is configured in a gap G2 between the $2i^{th}$ sensing unit 602 and the $(2i+1)^{th}$ sensing unit 602, so that the gap G2 can be shortened to a distance capable of insulation between the $2i^{th}$ sensing unit 602 and the $(2i+1)^{th}$ sensing unit 602. In this way, a ratio of the gap P3 between the second electrodes 630 in the third direction D3 and that gap P2 of the second electrodes 630 in the second direction D2 is about 1:3.4. Therefore, the sensing signals sensed by the $2i^{th}$ sensing unit 602 and the $(2i+1)^{th}$ sensing unit 602 may have ideal continuity, which avails enhancing the sensing linearity of the touch panel 600.

Figure 8:
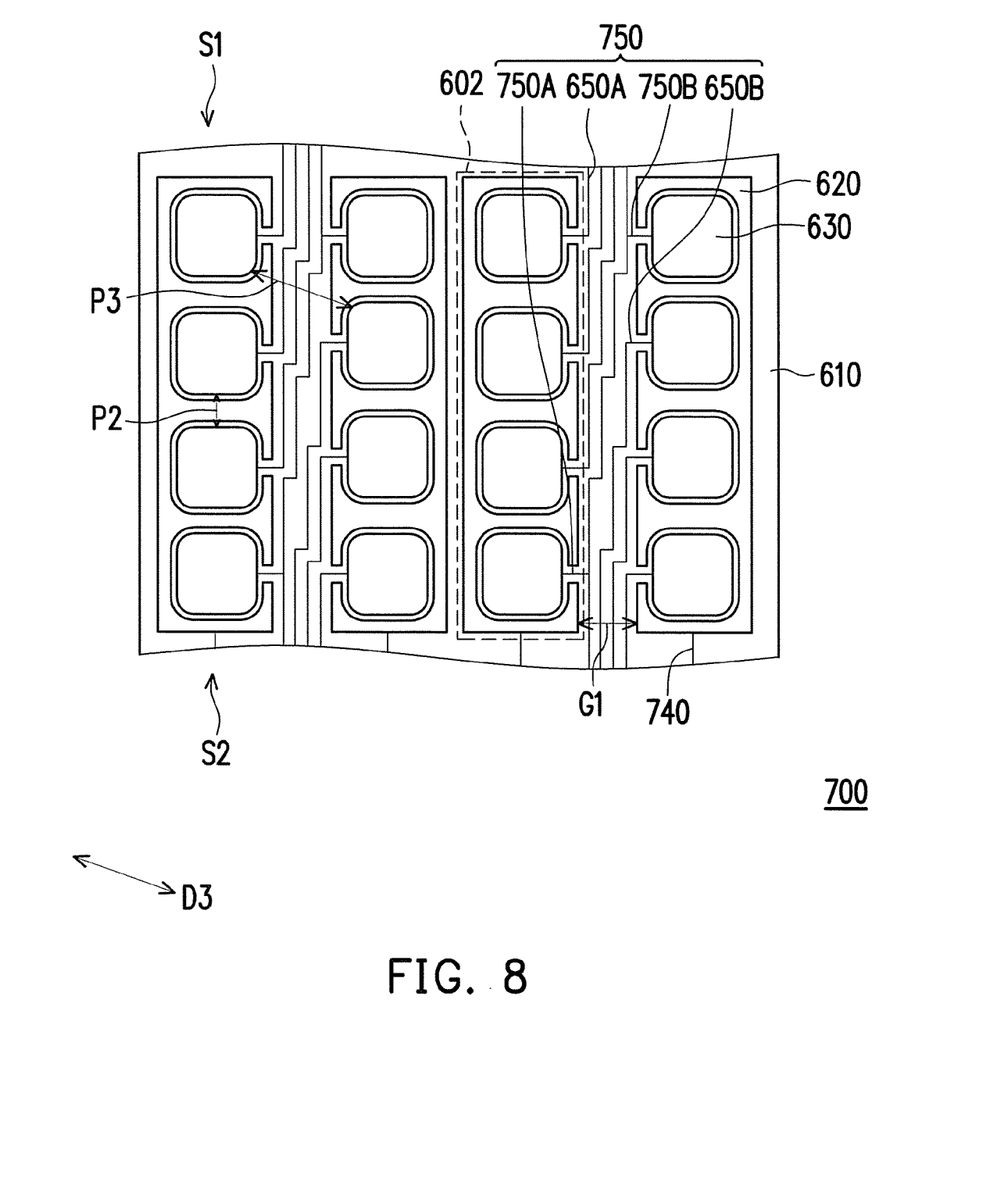
FIG. 8 is a top view of a touch panel according to a seventh embodiment of the invention.

FIG. 8 is a top view of a touch panel according to a seventh embodiment of the invention. Referring to FIG. 8, the touch panel 700 is similar to the touch panel 600 of the sixth embodiment, so that the same reference numbers denote the same or like components, and descriptions thereof are not repeated. A main difference between the present embodiment and the sixth embodiment is that the second wires 750, besides the second wire 650A and the second wire 650B, further include a second wire 750A and a second wire 750B of a shared layout path. In detail, in the present embodiment, the second wire 750A connected to one of the second electrodes 630 closest to the second side S2 in the $(2i-1)^{th}$ sensing unit 602 is connected to the second wire 750B connected to one of the second electrodes 630 closest to the first side S1 in the $2i^{th}$ sensing unit 602. In this way, the gap G1 between the $(2i-1)^{th}$ sensing unit 602 and the $2i^{th}$ sensing unit 602 is further shortened compared to that of the sixth embodiment, which avails shortening the gap P3 between the second electrodes 630 in the third direction D3 to enhance the sensing linearity of the touch panel 700.

Figure 9:
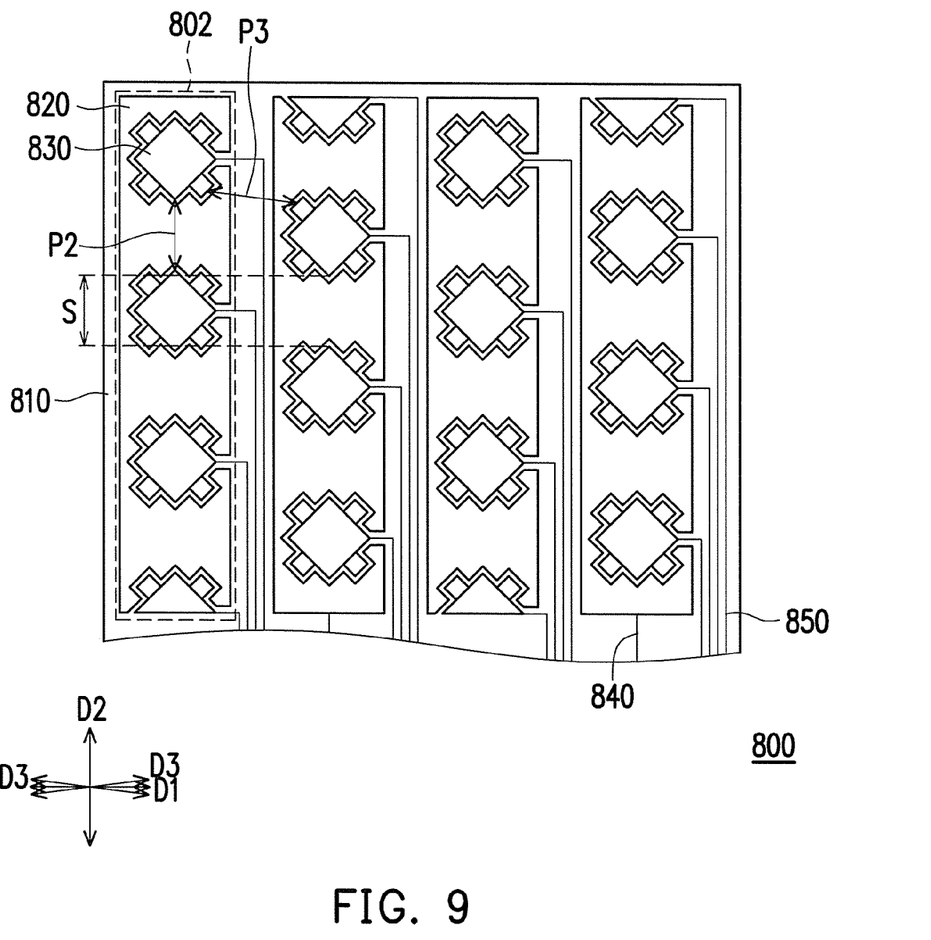
FIG. 9 is a top view of a touch panel according to an eighth embodiment of the invention.

FIG. 9 is a top view of a touch panel according to an eighth embodiment of the invention. Referring to FIG. 9, the touch panel 800 includes a substrate 810, a plurality of first electrodes 820, a plurality of second electrodes 830, a plurality of first wires 840 and a plurality of second wires 850. The first electrodes 820, the second electrodes 830, the first wires 840 and the second wires 850 are all disposed on the substrate 810. In the present embodiment, each of the first electrodes 820 surrounds a plurality of the second electrodes 830 to constitute a sensing unit 802. The first electrodes 820 are sequentially arranged along the first direction D1, and respectively have a bar-shape contour extending along the second direction D2, where the first direction D1 intersects the second direction D2. The first wires 840 are used to connect the first electrodes 820 to a driving circuit, and the second wires 840 are used to connect the second electrodes 830 to the driving circuit.

In the present embodiment, a contour of the second electrode 830 is approximately the same to the contour of the second electrode 130 depicted in the first embodiment. However, the second electrodes 830 of the $(2i-1)^{th}$ sensing unit 802 are respectively disposed corresponding to a position S where the gap between the second electrodes 830 of the $2i^{th}$ sensing unit 802 is such that a direction of connection lines of the second electrodes 830 of the $(2i-1)^{th}$ sensing unit 802 and the second electrodes 830 of the $2i^{th}$ sensing unit 802 is intersected to the first direction D1, which avails shortening the gap P3 between the second electrodes 830 in the third direction D3, and a ratio of the gap P3 between the second electrodes 830 in the third direction D3 and the gap P2 between the second electrodes 830 in the second direction D2 is about 1:2.7. Compared to the aforementioned embodiments, the gap P3 in the third direction D3 can be further decreased by 33%, by which a better sensing linearity is achieved.

Moreover, in the present embodiment, each of the sensing units 802 includes the second electrodes 830 of about 3.5 units even though the arrangements of the second electrodes 830 in different columns are alternative. Therefore, the sensing capabilities (for example, a magnitude of a coupling capacitance and a variation amount of a sensing capacitance between the first electrode 820 and the third electrode 830) of the sensing units 802 are approximately the same, which avails simplifying calculation of the touch sensing signals. It should be noticed that in the present embodiment, the contour of the second electrode 830 is similar to the design of the first embodiment, though the invention is not limited thereto. In other embodiments, the contour of the second electrode 830 can be the same to the design of any one of the second embodiment to the fourth embodiment. Moreover, the layout path of the second wire 850 can refer to related design of any one of the fourth to the seventh embodiment.

Figure 10:
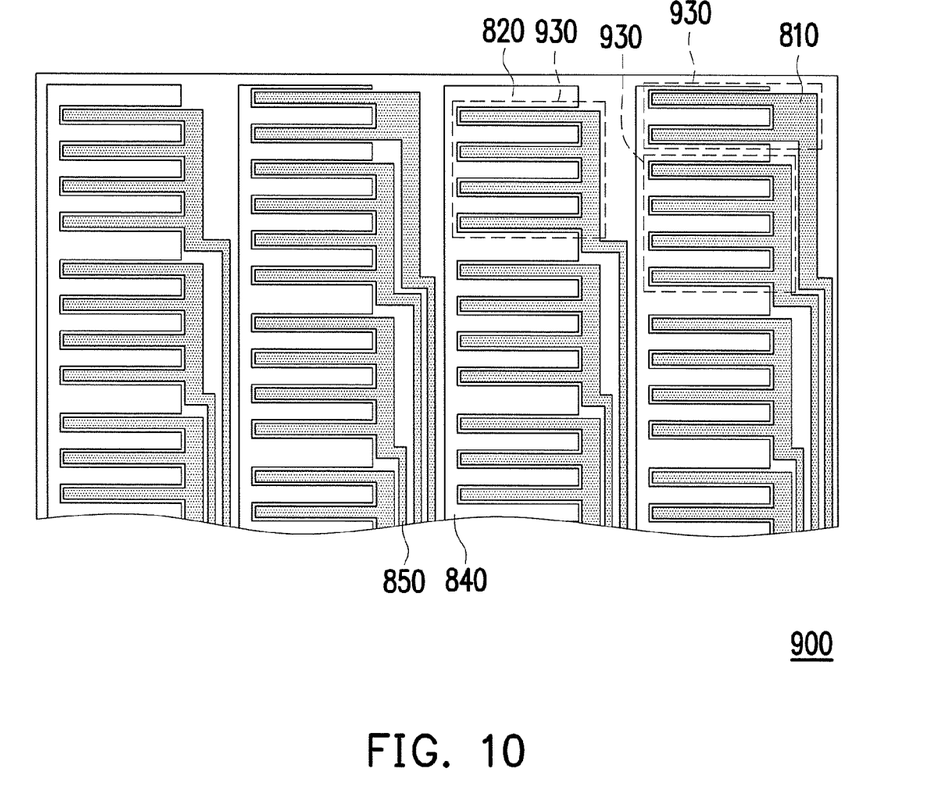
FIG. 10 is a top view of a touch panel according to a ninth embodiment of the invention.

Moreover, pattern designs of the electrodes are not limited to that described in the aforementioned embodiments. For example, FIG. 10 is a top view of a touch panel according to a ninth embodiment of the invention. Referring to FIG. 10, the touch panel 900 is similar to the touch panel 800, and a main difference therebetween lies in a pattern design of the second electrode. In detail, in the present embodiment, each of the second electrodes 930 has a comb-shape contour. Descriptions of the other components of the touch panel 900 can refer to the related descriptions of the eighth embodiment, which are not repeated.

In summary, in the touch panel of the present embodiment, based on pattern designs of the electrodes, changes in layout path of the wires and adjustment of electrode positions, the gap between two adjacent second electrodes can be decreased. Particularly, when the second electrodes are arranged in an array along the first direction and the second direction, a ratio of the gap between the second electrodes in the third direction and the gap between the second electrodes in the second direction can be smaller than 1:3.4, where the first direction, the second direction and the third direction are intersected to each other. In this way, an intensity of the sensing signal obtained when the touch operation is performed along any trace can be maintained at least above 29%, such that the touch panel may have ideal sensing linearity.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A touch panel, comprising:
a substrate;
a plurality of first electrodes, disposed on the substrate, and arranged sequentially in a first direction, wherein each of the first electrodes has a plurality of openings arranged in a second direction, and the first direction and the second direction are intersected;
a plurality of second electrodes, disposed on the substrate, and respectively located in the openings, wherein each of the first electrodes surrounds the second electrodes arranged along the second direction in a same column to constitute a sensing unit, and the sensing units are sequentially arranged along the first direction;
a plurality of first wires, connecting the first electrodes to a driving circuit;
a plurality of second wires, connecting the second electrodes to the driving circuit; and
a means for shortening a gap between the second electrodes in a third direction, rendering a ratio of the gap between the second electrodes in the third direction and the gap between the second electrodes in the second direction to be smaller than 1:3.4, wherein the third direction is intersected to the first direction and the second direction.

2. The touch panel as claimed in claim 1, wherein each of the second electrodes has a central pattern, a minimum gap between two of the central patterns of the second electrodes in the third direction is d1, and the means for shortening the gap between the second electrodes in the third direction comprises configuring a protrusion pattern connecting the central pattern to constitute each of the second electrodes, and the protrusion pattern protrudes from the central pattern towards the third direction, such that the minimum gap between the two second electrodes in the third direction is smaller than d1.

3. The touch panel as claimed in claim 2, wherein the central pattern is a diamond pattern or a double diamond pattern.

4. The touch panel as claimed in claim 1, wherein each of the second wires has a first terminal and a second terminal, the first terminal is connected to a corresponding one of the second electrodes, the second terminal points to a first side of the substrate along the second direction, and the substrate has a second side opposite to the first side.

5. The touch panel as claimed in claim 4, wherein one of the second wires connected to a $(2j-1)^{th}$ second electrode in a $(2i-1)^{th}$ sensing unit is located between the $(2i-1)$ sensing unit and a subsequent sensing unit, one of the second wires connected to a $2j^{th}$ second electrode in the $(2i-1)^{th}$ sensing unit is located between the $(2i-1)^{th}$ sensing unit and a previous sensing unit, one of the second wires connected to a $(2j-1)^{th}$ second electrode in a $2i^{th}$ sensing unit is located between the $2i^{th}$ sensing unit and a previous sensing unit, and one of the second wires connected to a $2j^{th}$ second electrode in the $2i^{th}$ sensing unit is located between the $2i^{th}$ sensing unit and the subsequent sensing unit, where i and j are respectively positive integers, and the means of shortening the gap between the second electrodes in the third direction comprises connecting one of the second wires connected to a $1^{st}$ second electrode in the $(2i-1)^{th}$ sensing unit with one of the second wires connected to a $1^{st}$ second electrode in the $2i^{th}$ sensing unit and connecting one of the second wires connected to a $2^{nd}$ second electrode in the $(2i+1)^{th}$ sensing unit with one of the second wires connected to a $2^{nd}$ second electrode in the $2i^{th}$ sensing unit.

6. The touch panel as claimed in claim 4, wherein the means of shortening the gap between the second electrodes in the third direction comprises gradually decreasing widths of the second electrodes of at least a part of the sensing units from the second side towards the first side.

7. The touch panel as claimed in claim 4, wherein the means of shortening the gap between the second electrodes in the third direction comprises that the second wires connected to a $(2i-1)^{th}$ sensing unit and the second wires connected to a 2ith sensing unit are located between the $(2i-1)^{th}$ sensing unit and the $2i^{th}$ sensing unit, wherein i is a positive integer.

8. The touch panel as claimed in claim 7, wherein each of the second wires has a first terminal and a second terminal, the first terminal is connected to a corresponding one of the second electrodes, the second terminal of one of the second wires connected to the $(2i-1)^{th}$ sensing unit points to a first side of the substrate along the second direction, the second terminal of one of the second wires connected to the $2i^{th}$ sensing unit points to a second side of the substrate along the second direction while the first side is opposite to the second side.

9. The touch panel as claimed in claim 8, wherein the means of shortening the gap between the second electrodes in the third direction comprises connecting one of the second wires connected to one of the second electrodes closest to the second side in the $(2i-1)^{th}$ sensing unit with one of the second wires connected to one of the second electrodes closest to the first side in the $2i^{th}$ sensing unit.

10. The touch panel as claimed in claim 1, wherein the means of shortening the gap between the second electrodes in the third direction comprises that the second electrodes of the $(2i-1)^{th}$ sensing unit correspond to a position of the gaps between the second electrodes of the $2i^{th}$ sensing unit such that a direction of connection lines of the second electrodes of the $(2i-1)^{th}$ sensing unit and the second electrodes of the $2i^{th}$ sensing unit is intersected to the first direction, wherein i is a positive integer.

11. The touch panel as claimed in claim 1, wherein each of the second electrodes has a comb-shape contour.

12. The touch panel as claimed in claim 1, wherein the first electrodes and the second electrodes are fabricated by a first conductive material, and the first wires and the second wires are fabricated by a second conductive material.

13. The touch panel as claimed in claim 12, wherein the first conductive material and the second conductive material are the same conductive material.

14. The touch panel as claimed in claim 12, wherein the first conductive material and the second conductive material are different conductive materials.

15. The touch panel as claimed in claim 12, wherein the first conductive material and the second conductive material comprise metal oxide, metal, metal stacked layer, organic conductive material or the combination thereof.

* * * * *